(12) United States Patent
Ino et al.

(10) Patent No.: US 8,115,261 B2
(45) Date of Patent: Feb. 14, 2012

(54) SEMICONDUCTOR DEVICE AND METHOD FOR MANUFACTURING THE SAME

(75) Inventors: Tsunehiro Ino, Fujisawa (JP); Yasushi Nakasaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 105 days.

(21) Appl. No.: 11/790,854

(22) Filed: Apr. 27, 2007

(65) Prior Publication Data

US 2007/0252232 A1 Nov. 1, 2007

(30) Foreign Application Priority Data

Apr. 28, 2006 (JP) .................................. 2006-125735

(51) Int. Cl.
*H01L 29/94* (2006.01)
(52) U.S. Cl. .................. 257/410; 257/310; 257/E21.423
(58) Field of Classification Search .................. 257/410, 257/310, E21.423
See application file for complete search history.

(56) References Cited

U.S. PATENT DOCUMENTS

2006/0081948 A1* 4/2006 Lim et al. ...................... 257/410

OTHER PUBLICATIONS

K. Tomida, et al., "Dielectric constant enhancement due to Si incorporation into $HfO_2$", Applied Physics Letter 89, 142902 (2006) pp. 142902-1-142902-3.

M.T. Lanagan et al., "The dielectric properties of yttria-stabilized zirconia.", Materials Letters, vol. 7, No. 12, (1989), pp. 437-440.

G.-M. Rignanese, "Dielectric properties of crystalline and amorphous transition metal oxides and silicates as potential high-$k$ candidates: the contribution of density-functional theory", J. Phys.: Condens. Matter 17 (2005) R357-R379.

G.-M. Rignanese, "First-principles investigation of high-$k$ dielectrics: Comparison between the silicates and oxides of hafnium and zirconium," Phsical Review B 69, 184301 (2004) pp. 1-10.

K. Kita, et al., "Permittivity increase of yttrium-doped $HfO_2$ through structural phase transformation", Applied Physics Letters 86, 102906 (2005) pp. 1-3.

Extended Abstracts ($53^{rd}$ Spring Meet. 2006); Japan Society of applied Physics and Related Societies, 25p-V-3; Kazuyuki Tomida, et al., "Permittivity Enhancement of $HfO_2$ Film with $SiO_2$ Doping and Analysis of its Origin", Dept. of Materials Eng., Schl. of Eng., The University of Tokyo.

(Continued)

*Primary Examiner* — Evan Pert
*Assistant Examiner* — Selim Ahmed
(74) *Attorney, Agent, or Firm* — Finnegan, Henderson, Farabow, Garrett & Dunner, L.L.P.

(57) ABSTRACT

It is made possible to provide a semiconductor device and a method for manufacturing the semiconductor device that have the highest possible permittivity and can be produced at low production costs. A method for manufacturing a semiconductor device, includes: forming an amorphous film containing $(Hf_zZr_{1-z})_xSi_{1-x}O_{2-y}$ ($0.81 \leq x \leq 0.99$, $0.04 \leq y \leq 0.25$, $0 \leq z \leq 1$) on a semiconductor substrate, the ranges of composition ratios x, y, and z being values measured by XPS; and transforming the amorphous film into an insulating film containing $(Hf_zZr_{1-z})_xSi_{1-x}O_2$ as tetragonal crystals, by performing annealing at 750° C. or higher on the amorphous film in an atmosphere containing oxygen.

8 Claims, 10 Drawing Sheets

OTHER PUBLICATIONS

Extended Abstracts (53rd Spring Meet. 2006) Japan Society of applied Physics and Related Societies, 25p-V-4; K. Kita et al., "Methodology for designing ternary higher-k dielectrics through metal doping into the $HfO_2$ thin films", Dept. of Materials Engineering, The Univ. of Tokyo.

J.M. Leger, et al., "Pressure-induced structural phase transitions in zirconia under high pressure," Physical Review B, vol. 47, No. 21 (1993) pp. 14 075-14 083.

O. Ohtaka, et al., "Phase Relations and Volume Changes of Hafnia under High Pressure and High Temperature," J. Am. Ceram. Soc., vol. 84, No. 6 (2001), pp. 1369-1373.

T. Ino, et al., "Dielectric Constant Behavior of Hf-O-N System", Japan Journal of Applied Physics, vol. 45, No. 4B (2006) pp. 2908-2913.

T. Ino, et al., "Dielectric Constant Behavior or Oriented Tetragonal Zr-Si-O System," Extended Abstracts of the 2006 International Conference on Solid State Devices and Materials, Yokohama, 2006. pp. 404-405.

Extended Abstracts (54th Spring Meet. 2007) Japan Society of Applied Physics and Related Societies, 28p-Zh-14; Tsunehiro Ino, et al., "Anisotropic relative dielectric constant of tetragonal $Zr_{1-x} Si_x O_2$ film", Toshiba Corporation, Corporate R&D Center.

K. Tomida, et al., "Far Infrared Study of Structural Distortion and Transformation of $HfO_2$ by Introducing a Slight Amount of Si", Extended Abstracts of the 2004 International Conference on Solid State Devices and Materials, Tokyo, 2004, pp. 790-791.

K. Kita, et al., "Dielectric Constant Increase of Yttrium-Doped $HfO_2$ by Structural Phase Modification", Extended Abstracts of the 2004 International Conference on Solid State Devices and Materials, Tokyo, 2004, pp. 794-795.

K. Tomida, et al., "Permittivity Enhancement of $Hf_{(1-x)} Si_x O_2$ Film with High Temperature Annealing", Extended Abstracts of the 2005 Intenational Conference on Solid State Devices and Mateials, Kobe, 2005, pp. 232-233.

Ruh et al., "The System Zirconia-Hafnia," Journal of the American Ceramic Society (1968), 51:23-27.

Tdufer, "The crystal structure of tetragonal $ZrO_2$," Acta. Cryst. (1962), 15:1187.

JCPDS (Joint Committee on Powder Diffraction Standards, current ICDD: International Centre for Diffraction Data), card No. 34-0104.

Cullity, B.D., Elements of X-Ray Diffraction, Addison-Wesley Metallurgy Series, Addison-Wesley Pub. Co., 1956, pp. v-xiv, 1-17, Appendix 3.

Levy, R.A., Microelectronic Materials and Processes, Proceedings of the NATO Advanced Study Institute, II Ciocco, Castelvecchio Pascoli, Italy, 1986, pp. v, vi 183-189.

* cited by examiner

SEMICONDUCTOR DEVICE AND METHOD FOR MANUFACTURING THE SAME

CROSS-REFERENCE TO RELATED APPLICATION

This application is based upon and claims the benefit of priority from prior Japanese Patent Application No. 2006-125735 filed on Apr. 28, 2006 in Japan, the entire contents of which are incorporated herein by reference.

BACKGROUND OF THE INVENTION

1. Field of the Invention

The present invention relates to a semiconductor device and a method for manufacturing the semiconductor device.

2. Related Art

The insulating films in semiconductor devices have become thinner by the improved semiconductor techniques for producing smaller devices. In semiconductor production, $SiO_2$ is an excellent insulating material, and has been used over a long period of time. In a gate insulating film, however, the film thickness of a $SiO_2$ film has become as small as the size equivalent to a few atomic layers. As a result, it has become difficult in principle to restrain current leakage through such a thin insulating film. Instead of $SiO_2$, a material having higher permittivity can be used as an insulating film, and the material can electrically serve as if it were a thin $SiO_2$ film. Even if such a film is thicker than the few atomic layers in the case of a $SiO_2$ film, the film is electrically equivalent to the $SiO_2$ film. Accordingly, it is assumed that current leakage can be restrained with such a film.

In a flash memory or the like, there is an interelectrode insulating film that isolates the control gate from the floating gate. However, such an interelectrode insulating film is also expected to have higher permittivity, as the device size has become smaller.

In this trend, high-permittivity insulating films (high-k films) have been studied, and as of today, gate insulating films containing hafnium are considered to have the greatest potential. However, the permittivity of a gate insulating film containing hafnium is approximately 25 at a maximum. In practice, the composition ratio of hafnium is highly likely to be lower than that. Therefore, such a gate insulating film containing hafnium as a high-k film can achieve relative permittivity as low as 12.

If a tetragonal crystalline structure can be formed from zirconia (zirconium oxide) or hafnia (hafnium oxide) through the first principle calculation, higher relative permittivity might be achieved. This possibility is suggested in by G. -M. Ringanese, X. Gonze, G. Jun, K. Cho, and A. Pasquarello in Phys. Rev. B69, 184301 (2004) (hereinafter referred to as Reference 1), for example. To confirm the possibility through experiments, they have tried to form tetragonal crystalline structures by adding yttrium to zirconia, or hafnia (disclosed by H. Kita, K. Kyuno, and A. Toriumi, in Appl. Phys. Lett. 86, 102906 (2005)) (hereinafter referred to as Reference 2).

Further, increases in permittivity by adding silicon to hafnia are disclosed by I. Tomida, H. Kita, K. Kyuno, and A. Toriumi in Appl. Phys. Spring Lectures, 25P-V-3, 2006 (hereinafter referred to as Reference 3).

By the technique disclosed in Reference 2, however, a tetragonal crystalline structure has not successfully been produced to provide the highest relative permittivity, as can be seen from the X-ray diffraction profiles.

In Reference 2, they tried to increase the permittivity by using rare-earth elements or alkaline-earth elements that were rarely used in semiconductor processes. Since those elements are soluble with zirconia and hafnia, it was considered that the permittivity could be easily increased with those materials. However, in the real semiconductor manufacturing processes that thoroughly refuse contamination, it is not easy to predict all the side effects and adverse influence that might be caused by the introduction of a rare-earth element or an alkaline-earth element. Therefore, the costs for introducing rare-earth elements or alkaline-earth elements are predicted to be very high.

If the dielectric disclosed in Reference 3 is used as a gate insulating film in real LSI production, as described later, the mobility might be reduced due to the stress exerted on the channel region in direct contact with the gate insulating film, or lattice relaxation to reduce the relative permittivity to the original value might be caused in the gate insulating film, or the gate insulating film might break itself because of the stress. As a result, the device characteristics might be degraded.

SUMMARY OF THE INVENTION

The present invention has been made in view of these circumstances, and an object thereof is to provide a semiconductor device and a method for manufacturing the semiconductor device that have the highest possible permittivity and can be produced at low production costs.

A method for manufacturing a semiconductor device according to a first aspect of the present invention includes: forming an amorphous film containing $(Hf_zZr_{1-z})_xSi_{1-x}O_{2-y}$ ($0.81 \leq x \leq 0.99$, $0.04 \leq y \leq 0.25$, $0 \leq z \leq 1$) on a semiconductor substrate, the ranges of composition ratios x, y, and z being values measured by XPS; and transforming the amorphous film into an insulating film containing $(Hf_zZr_{1-z})_xSi_{1-x}O_2$ as tetragonal crystals, by performing annealing at 750° C. or higher on the amorphous film in an atmosphere containing oxygen.

A method for manufacturing a semiconductor device according to a second aspect of the present invention includes: forming an amorphous film containing $(Hf_zZr_{1-z})_xSi_{1-x}O_{2-y}$ ($0.76 \leq x \leq 0.985$, $0.04 \leq y \leq 0.25$, $0 \leq z \leq 1$) on a semiconductor substrate, the ranges of composition ratios x and z being values measured by RBS, the range of a composition ratio y being values measured by XPS; and transforming the amorphous film into an insulating film containing $(Hf_zZr_{1-z})_xSi_{1-x}O_2$ as tetragonal crystals, by performing annealing at 750° C. or higher on the amorphous film in an atmosphere containing oxygen.

A semiconductor device according to a third aspect of the present invention includes: an insulating film containing $(Hf_zZr_{1-z})_xSi_{1-x}O_2$ ($0.81 \leq x \leq 0.99$, $0 \leq z \leq 1$) formed on a semiconductor substrate, the ranges of composition ratios x and z being values measured by XPS, the insulating film having a main phase that is a tetragonal fluorite-type crystalline structure, molecular volume $V_m$ of tetragonal crystals in the insulating film being in the range of 0.03353 $nm^3 \leq V_m \leq 0.03424$ $nm^3$ per $(Hf_zZr_{1-z})_xSi_{1-x}O_2$, the insulating film having a physical film thickness of 110 nm or smaller.

A semiconductor device according to a fourth aspect of the present invention includes: an insulating film containing $(Hf_zZr_{1-z})_xSi_{1-x}O_2$ ($0.76 \leq x \leq 0.985$, $0 \leq z \leq 1$) formed on a semiconductor substrate, the ranges of composition ratios x and z being values measured by RBS, the insulating film having a main phase that is a tetragonal fluorite-type crystalline structure, molecular volume $V_m$ of tetragonal crystals in the insulating film being in the range of 0.03353 nm$^3 \leq V_m \leq 0.03424$ nm$^3$ per (Hf$_z$Zr$_{1-z}$)$_x$Si$_{1-x}$O$_2$, the insulating film having a physical film thickness of 110 nm or smaller.

DETAILED DESCRIPTION OF THE INVENTION

The following is a description of embodiments of the present invention, with reference to the accompanying drawings.

In each of the embodiments of the present invention, Si, which is generally considered not soluble, is added to zirconia or hafnia, so as to increase the permittivity. In XPS (X-ray Photoelectron Spectroscopy) measurement, 6 atomic % to 14 atomic % of Si is added, and in RBS (Rutherford Backscattering Spectrometry) measurement, 8 atomic % to 19 atomic % of Si is added, so as to form a thin film having tetragonal crystals with a lattice constant approximately 1% smaller than that of conventional tetragonal crystals. This thin film has a crystalline structure in which the moving range of oxygen ions in the tetragonal crystals is wider. As the polarizability is approximately 8% higher, a permittivity of 20 to 26 that is higher than 17, which is the relative permittivity of zirconia and hafnia, can be achieved.

In the following embodiments, in the XPS measurement, the relative sensitivity coefficient of a Si2p peak is 0.37, the relative sensitivity coefficient of Zr3d is 2.40, and the relative sensitivity coefficient of Hf4f is 2.56. In the RBS measurement, He$^+$ ions are used with an acceleration voltage of 2.275 MeV, a scattering angle of 160 degrees, and a dose amount of 40 μc.

First Embodiment

A method for manufacturing a semiconductor device in accordance with a first embodiment of the present invention is described.

Figure 1:
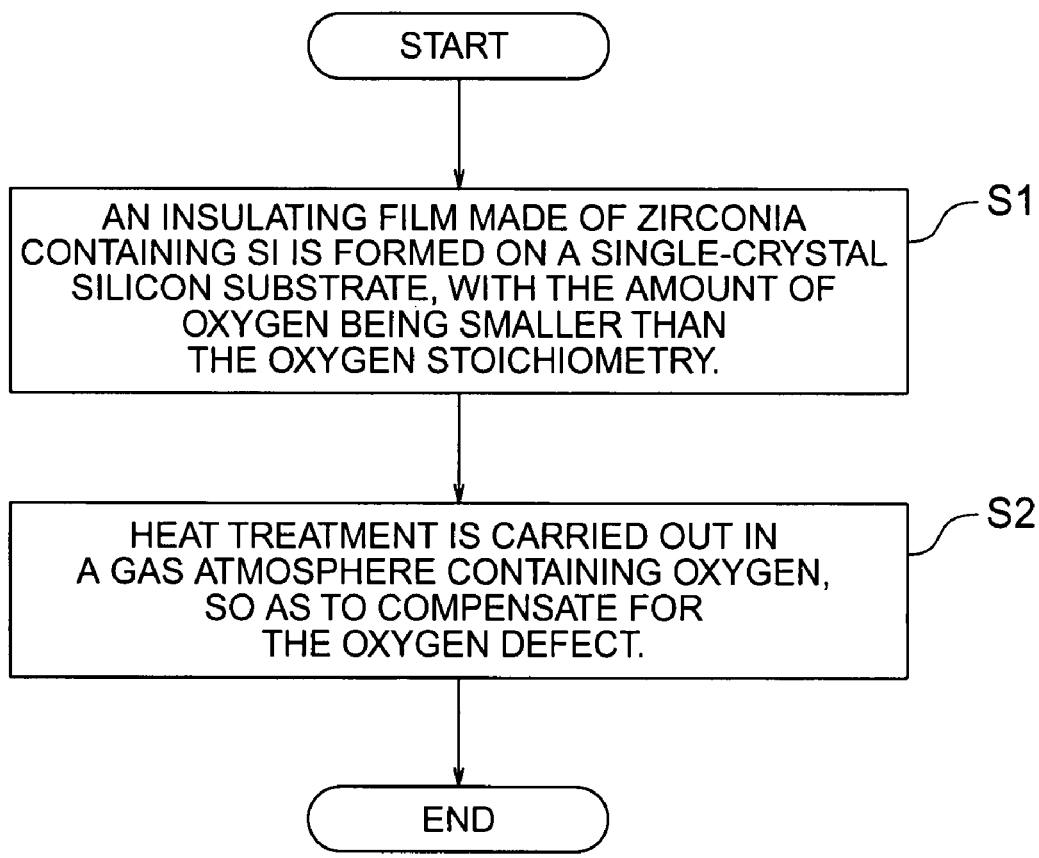
FIG. 1 is a flowchart showing the procedures by a method for manufacturing a semiconductor device in accordance with each embodiment.

First, as shown in step S1 of FIG. 1, an amorphous insulating film that had a composition of Zr$_{0.86}$Si$_{0.14}$O$_{1.75}$ in the XPS measurement with a smaller amount of oxygen than the oxygen stoichiometry was formed on a single-crystal silicon substrate that had a natural oxide film removed with a diluted hydrofluoric acid. The amorphous insulating film was formed by a sputtering technique, and the film formation was carried out in a mixed atmosphere of argon and oxygen, with Zr and Si being the targets. The amount of oxygen loss is the value obtained on the basis of the ratio of the peak intensity of a Zr—O bond of Zr3d measured by XPS to the peak intensity of a Zr—Zr or Zr—Si bond measured by XPS, on the assumption that the peaks of Zr—Zr and Zr—Si bonds were all caused by the oxygen loss.

As shown in step S2 of FIG. 1, the substrate having the amorphous insulating film formed with Zr$_{0.86}$Si$_{0.14}$O$_{1.75}$ was placed in a heat treatment chamber, and was subjected to heat treatment. The heat treatment was performed at 800° C., and the heat treatment time was 30 seconds. The atmosphere gas for the heat treatment was a mixed gas of nitrogen and oxygen, and the mixed gas was a nitrogen-based gas, containing only 1 ppm of oxygen. The pressure in the heat treatment was atmospheric pressure. The oxygen defect in the amorphous insulating film formed with Zr$_{0.86}$Si$_{0.14}$O$_{1.75}$ was compensated for in the above heat treatment, and the amorphous insulating film formed with Zr$_{0.86}$Si$_{0.14}$O$_{1.75}$ was transformed into an insulating film formed with Zr$_{0.86}$Si$_{0.14}$O$_2$. The fact that there was no oxygen loss in the sample after the heat treatment was proved by the phenomenon that there were no peaks of Zr—Zr or Zr—Si bonds in the XPS measurement.

Figure 2:
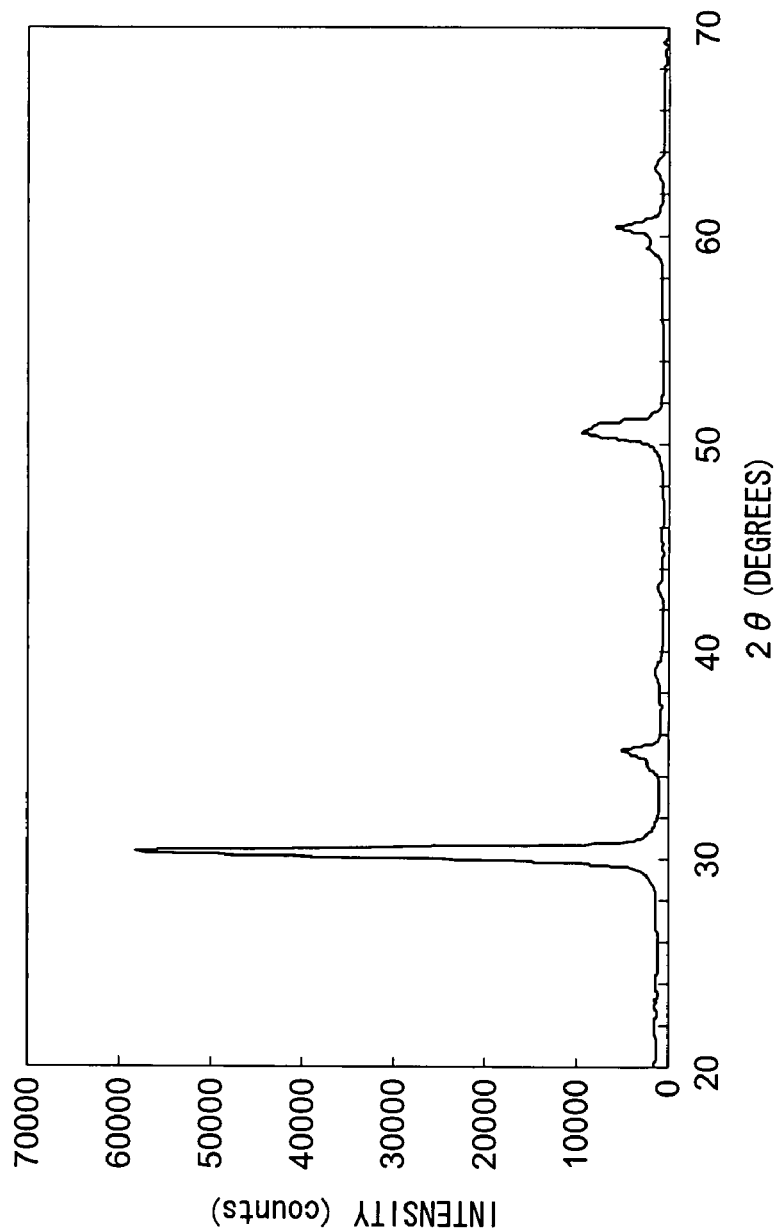
FIG. 2 shows an X-ray diffraction profile indicating a tetragonal crystalline state in an insulating film produced by a manufacturing method in accordance with a first embodiment.
Figure 3:
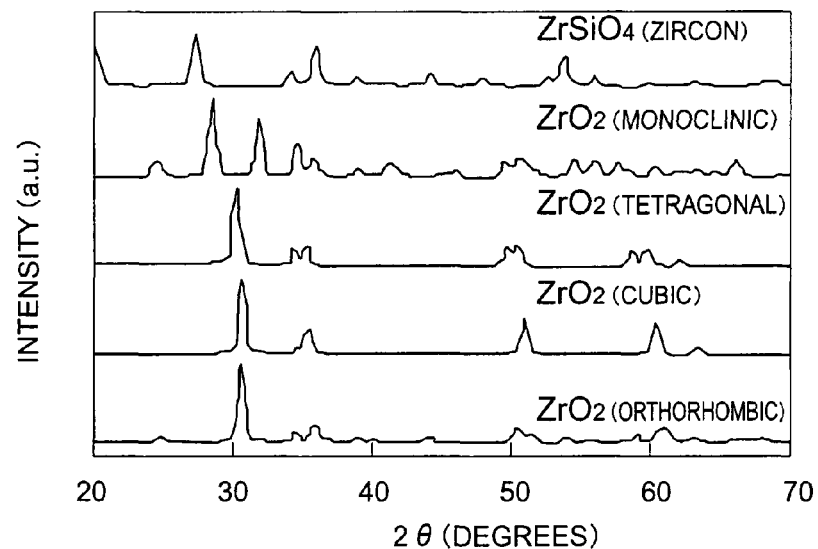
FIG. 3 shows X-ray diffraction peak intensities calculated with respect to a variety of zirconia crystalline structures.

Next, X-ray diffraction measurement was carried out for the insulating film formed with Zr$_{0.86}$Si$_{0.14}$O$_2$. The X-ray diffraction profile obtained as a result of the measurement is shown in FIG. 2. The X-ray diffraction profile shown in FIG. 2 is similar to the X-ray diffraction profile of tetragonal zirconia calculated and shown in FIG. 3. Therefore, the insulating film formed with Zr$_{0.86}$Si$_{0.14}$O$_2$ produced by the method of this embodiment can be considered to be tetragonal zirconia. However, when the lattice constant of the insulating film formed with Zr$_{0.86}$Si$_{0.14}$O$_2$ produced by the method of this embodiment was measured through X-ray diffraction and was compared with the lattice constant (a=b=0.3640 nm, c=0.5270 nm) of tetragonal zirconia disclosed in "Acta Cryst. 15, 1187, 62", the lattice constant of the insulating film formed with Zr$_{0.86}$Si$_{0.14}$O$_2$ produced by the method of this embodiment was approximately 1% lower (a=b=0.3605±0.0003 nm, c=0.5206±0.0006 nm). FIG. 3 shows the X-ray diffraction peak intensities calculated with respect to a variety of zirconia crystalline structures.

The reason that an insulating film having a tetragonal zirconia crystalline structure that has been difficult to produce can be formed by the method of this embodiment is considered to be the existence of stress applied onto the insulating film. More specifically, by the method of this embodiment, an amorphous insulating film that had a composition of $Zr_{0.86}Si_{0.14}O_{1.75}$ with a smaller amount of oxygen than the oxygen stoichiometry was first formed. Annealing was then performed to compensate for the oxygen defect. As a result, the volume of the insulating film increased. However, since the insulating film was attached to the substrate, the insulating film could not expand in the in-plane direction. Compressive stress was then applied onto the insulating film, resulting in an approximately 1% decrease of the lattice constant of the crystals of the insulating film.

Figure 4:
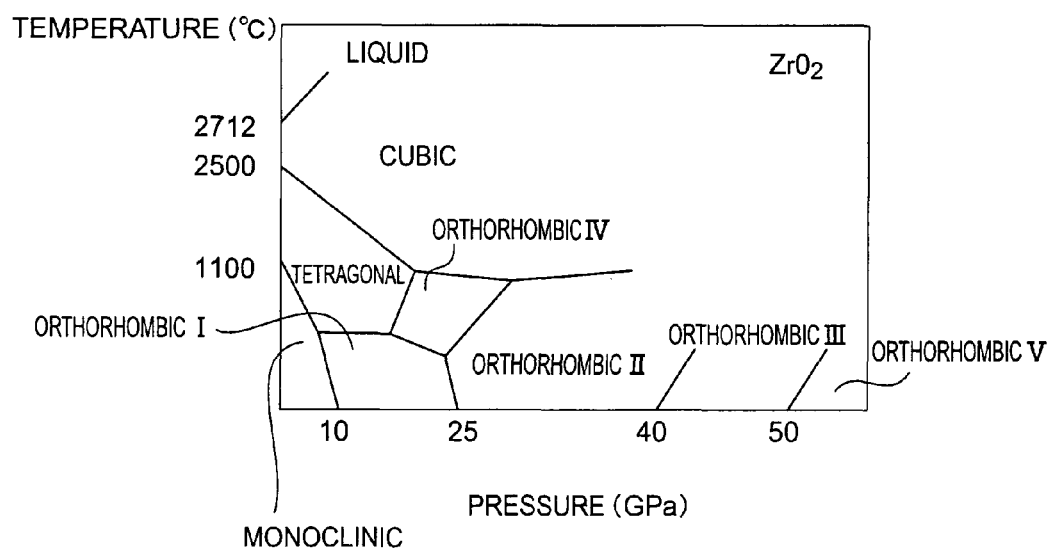
FIG. 4 is a temperature-pressure phase diagram about zirconia.

FIG. 4 is a temperature-pressure phase diagram about zirconia (see J. M. Leger, R E. Tomaszewski, A. Atouf, and A. S. Pereira, Phys. Rev. B47, 14075 (1993)). As is clear from FIG. 4, as the pressure becomes higher, the temperature at which the tetragonal crystals in zirconia can stably exist in a crystalline state becomes lower. Accordingly, since the requirements for obtaining stable tetragonal crystals at room temperature were satisfied, the production of tetragonal crystals by the manufacturing method of this embodiment is considered to be a success.

Figure 13:
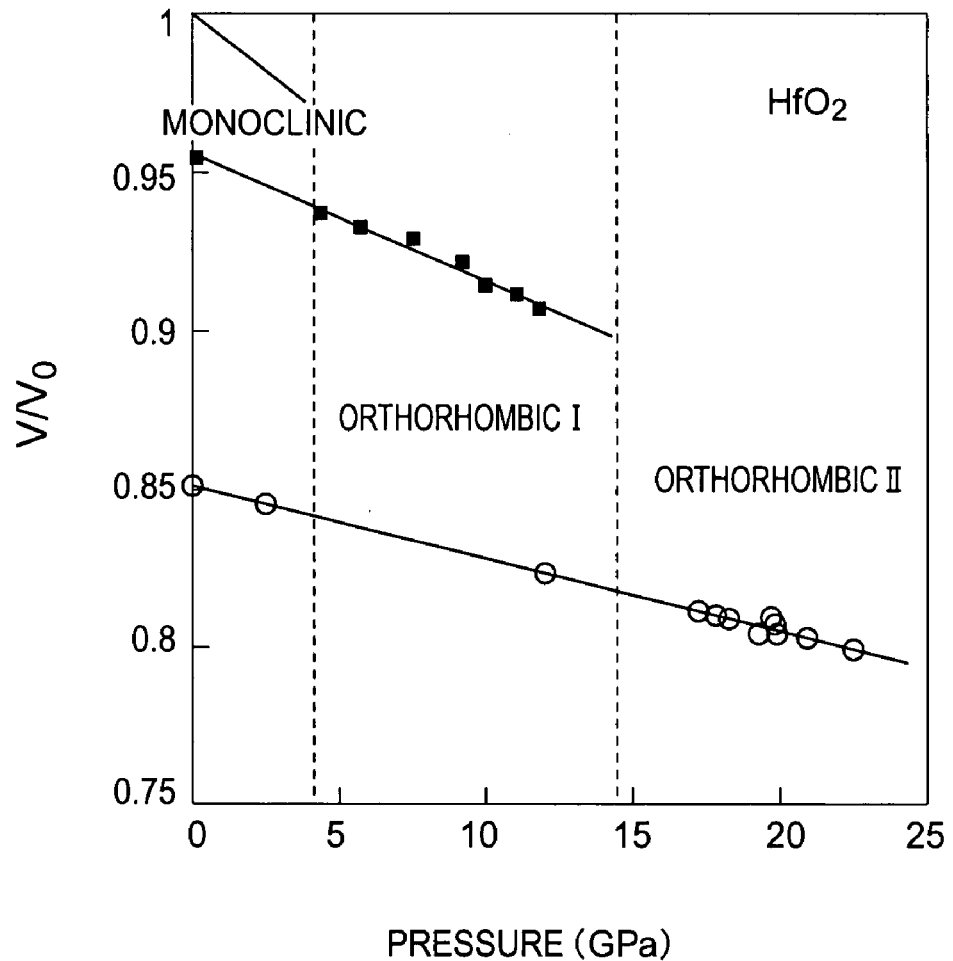
FIG. 13 shows the pressure dependence of the unit call volume of hafnia crystals.

Here, the insulating film disclosed in Reference 3 is again described. The insulating film disclosed in Reference 3 has a permittivity increased by adding silicon to hafnia. The molar polarizability of the atoms in the insulating film disclosed in Reference 3 is in the range of $0.00669 \text{ nm}^3$ to $0.00673 \text{ nm}^3$, and does not change substantially. In that structure, the permittivity is increased by reducing the molecular volume (or the molar volume) by approximately 9%. According to a calculation made by the inventor, to achieve such a small molecular volume, the stress exered by distortions in the insulating film must be as large as 9 GPa. FIG. 13 shows the results of examinations that were conducted to check changes in lattice constant by applying stress onto hafnia (see Osamu Ohtaka, Hiroshi Fukui, Taichi Kunisada, Tomoyuki Fujisawa, Kenichi Funakoshi, Wataru Utsumi, Tetsuo Irifune, Koji Kuroda, and Takumi Kikegawa, J. Am. Ceram. Soc., 84[6] 1369-73 (2001)). In FIG. 13, the abscissa axis indicates the stress to be applied, and the ordinate axis indicates the rate of the volume V of each unit lattice of hafnia crystals at the applied pressure to the volume $V_0$ of each unit lattice of hafnia crystals at atmospheric pressure. As can be seen from FIG. 13, the hafnia that is in a thermal equilibrium state at atmospheric pressure has phase transition to an orthorhombic phase I at a high pressure, and has further phase transition to an orthorhombic phase II at a higher pressure. Those crystalline structures are different from tetragonal crystalline structures, but FIG. 13 shows that a stress as large as 10 GPa needs to be applied so as to reduce the molecular volume by 9% in a monoclinic crystalline structure. In other words, in a hafnia film having a 9% decrease in molecular volume, a stress as large as 10 GPa is exerted. It is known that even sapphire, which is the second hardest naturally-produced ore, only next to diamond, cannot endure such a large stress with crystals of macroscopic size. In a more precise estimate, the stress in the film is not smaller than 8 GPa. Therefore, if the insulating film disclosed in Reference 3 is used as a gate insulating film in an actual LSI, the mobility might be reduced due to the stress applied onto the channel region in direct contact with the gate insulating film, lattice relaxation caused in the gate insulating film might return the relative permittivity to the original value, or the gate insulating film might break itself because of the stress.

On the other hand, the stress applied onto the insulating film of this embodiment is 1 GPa or smaller, which is much smaller than the stress applied onto the insulating film disclosed in Reference 3. Accordingly, the device characteristics do not deteriorate.

Furthermore, Si, which is very often used in semiconductor processes as an element to be added to zirconia, is used in this embodiment. Accordingly, the production costs become as low as possible.

Also, as described later, the insulating film produced in this embodiment has a very high permittivity, with the relative permittivity being 20 to 26, which is higher than the relative permittivity of zirconia.

The composition of the above sample after the heat treatment was determined by a direct measurement method in accordance with RBS, to obtain the composition values of $Zr_{0.81}Si_{0.19}O_2$. As long as the measurement carried out by us is concerned, the molar ratio of [Si]/([Zr]+[Si]) determined by a direct measurement method in accordance with RBS is considered to be more reliable. On the other hand, in the semi-quantitative measurement by XPS, it is difficult to achieve high reliability, as there is surface contamination or the like due to the exposure of the sample in the atmosphere. However, the amount of oxygen loss is more accurate in the measurement by the XPS, since the oxygen peak intensity is very low by RBS. Accordingly, it is assumed that a composition of $Zr_{0.81}Si_{0.19}O_{1.75}$ is obtained by determining the molar ratio of [Si]/([Zr]+[Si]) by RBS and determining the amount of oxygen loss by XPS in the sample in an as-depo state before the heat treatment.

Second Embodiment

Next, a method for manufacturing a semiconductor device in accordance with a second embodiment of the present invention is described.

First, as shown in step S1 of FIG. 1, an amorphous insulating film that had a composition of $Zr_{0.81}Si_{0.19}O_{1.80}$ in the semi-quantitative measurement by XPS with a smaller amount of oxygen than the oxygen stoichiometry was formed on a single-crystal silicon substrate that had a natural oxide film removed with a diluted hydrofluoric acid. The amorphous insulating film was formed by a sputtering technique, and the film formation was carried out in a mixed atmosphere of argon and oxygen, with Zr and Si being the targets.

As shown in step S2 of FIG. 1, the substrate having the amorphous insulating film formed with $Zr_{0.81}Si_{0.19}O_{1.80}$ was placed in a heat treatment chamber, and was subjected to heat treatment. The heat treatment was performed at 800° C., and the heat treatment time was 8 minutes. The atmosphere gas for the heat treatment was a mixed gas of argon and oxygen, and the mixed gas was an argon-based gas, containing only 10 ppm of oxygen. The pressure in the heat treatment was atmospheric pressure. The oxygen defect in the amorphous insulating film formed with $Zr_{0.81}Si_{0.19}O_{1.80}$ was compensated for in the above heat treatment, and the amorphous insulating film formed with $Zr_{0.81}Si_{0.19}O_{1.80}$ was transformed into an insulating film formed with $Zr_{0.81}Si_{0.19}O_2$.

Figure 5:
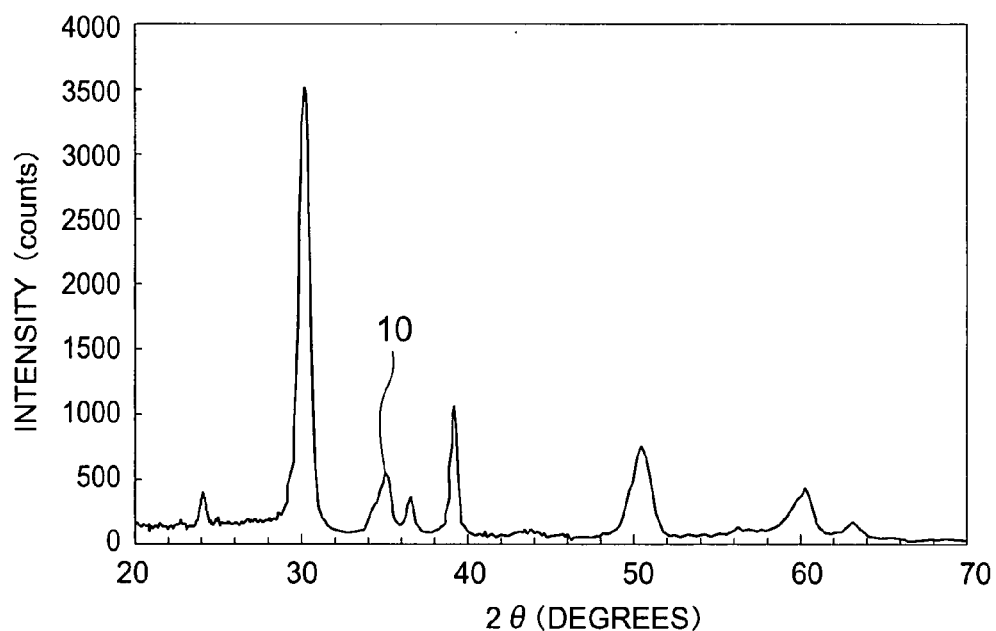
FIG. 5 shows an X-ray diffraction profile indicating a tetragonal crystalline state in an insulating film produced by a manufacturing method in accordance with a second embodiment.

Next, X-ray diffraction measurement was carried out for the insulating film formed with $Zr_{0.81}Si_{0.19}O_2$. The X-ray diffraction profile obtained as a result of the measurement is shown in FIG. 5. The X-ray diffraction profile shown in FIG. 5 is similar to the X-ray diffraction profile of tetragonal zirconia calculated and shown in FIG. 3. Therefore, the insulating film formed with $Zr_{0.81}Si_{0.19}O_2$ produced by the method of this embodiment can be considered to be tetragonal zirconia. However, when the lattice constant of the insulating film formed with $Zr_{0.81}Si_{0.19}O_2$ produced by the method of this embodiment was measured through X-ray diffraction and was compared with the lattice constant (a=b=0.3640 nm, c=0.5270 nm) of tetragonal zirconia disclosed in "Acta Cryst. 15, 1187, 62", the lattice constant of the insulating film formed with $Zr_{0.81}Si_{0.19}O_2$ produced by the method of this embodiment was approximately 1% lower (a=b=0.3595±0.0005 nm, c=0.5190±0.0007 nm). As in the first embodiment, this is because that compressive stress was applied onto the insulating film produced by the method of this embodiment, resulting in an approximately 1% decrease of the lattice constant of the crystals of the insulating film.

Thus, as in the first embodiment, a semiconductor device that has a highest possible permittivity and do not degrade the device characteristics can also be produced at low production costs in this embodiment.

Here, the X-ray diffraction profile shown in FIG. 5 is described in greater detail. On closer inspection, there is a small peak of monoclinic zirconia, as indicated by reference numeral 10. The reason of the existence of this peak may be that the addition of Si increases to 19 atomic % in terms of the [Si]/([Si]+[Zr]) ratio. However, with such a small amount of monoclinic crystals being added, the insulating film of this embodiment is still highly usable as a high-k film.

The composition of this film after the heat treatment was determined by a direct measurement method in accordance with RBS, to obtain the composition values of $Zr_{0.76}Si_{0.24}O_2$. Accordingly, it can be assumed that a composition of $Zr_{0.76}Si_{0.24}O_{1.80}$ is obtained by determining the molar ratio of [Si]/([Zr]+[Si]) by RBS and determining the amount of oxygen loss by XPS in the sample in an as-depo state before the heat treatment.

Third Embodiment

Next, a method for manufacturing a semiconductor device in accordance with a third embodiment of the present invention is described.

First, as shown in step S1 of FIG. 1, an amorphous insulating film that had a composition of $Zr_{0.99}Si_{0.01}O_{1.90}$ in the measurement by XPS with a smaller amount of oxygen than the oxygen stoichiometry was formed on a single-crystal silicon substrate that had a natural oxide film removed with a diluted hydrofluoric acid. The amorphous insulating film was formed by a sputtering technique, and the film formation was carried out in a mixed atmosphere of argon and oxygen, with Zr and Si being the targets.

As shown in step S2 of FIG. 1, the substrate having the amorphous insulating film formed with $Zr_{0.99}Si_{0.01}O_{1.90}$ was placed in a heat treatment chamber, and was subjected to heat treatment. The heat treatment was performed at 1050° C., and the heat treatment time was 2 minutes. The atmosphere gas for the heat treatment was a pure oxygen gas. The pressure in the heat treatment was atmospheric pressure. Through this heat treatment, the amorphous insulating film formed with $Zr_{0.99}Si_{0.01}O_{1.90}$ was transformed into an insulating film formed with $Zr_{0.99}Si_{0.01}O_2$.

X-ray diffraction measurement was carried out for the insulating film formed with $Zr_{0.99}Si_{0.01}O_2$ by the manufacturing method of this embodiment. The X-ray diffraction profile obtained as a result of the measurement was similar to the X-ray diffraction profile of tetragonal zirconia. Therefore, the insulating film formed with $Zr_{0.99}Si_{0.01}O_2$ produced by the method of this embodiment can be considered to be tetragonal zirconia.

Thus, as in the first embodiment, a semiconductor device that has a highest possible permittivity and do not degrade the device characteristics can also be produced at low production costs in this embodiment.

As can be seen from the above embodiments, tetragonal crystals are obtained, with the heat treatment time being in the range of 30 seconds to 8 minutes, the heat treatment temperature being in the range of 800° C. to 1050° C., and the oxygen concentration in the atmosphere gas being in the range of 1 ppm to 100%. Also, tetra-gonal crystals are obtained, with the atmosphere gas pressure being varied from $10^{-2}$ Pa to $10^5$ Pa (atmospheric pressure).

As a comparative example, an insulating film having a composition of $Zr_{1-x}Si_xO_2$ without an oxygen defect was formed. In this insulating film, only monoclinic or cubic crystals appeared. After the insulating film having a composition of $Zr_{1-x}Si_xO_2$ as a comparative example was subjected to heat treatment, the monoclinic-cubic ratio was easily changed.

By any of the manufacturing methods of the first through third embodiments, on the other hand, tetragonal crystals can be maintained with a very wide range of heat treatment conditions. As described above, it was found that there was a wide range of heat treatment conditions in a ZrSiO film having tetragonal crystals produced by any of the manufacturing methods of the first through third embodiments, and the tetragonal crystals were maintained after any type of heat treatment in each of the procedures for manufacturing a real semiconductor device. This means that the problem with the material disclosed in Reference 3, which cannot be applied to an actual LSI process, is completely solved, and each of the embodiments is beneficial in practical use.

In each of the first through third embodiments, an amorphous insulating film that had a composition of $Zr_xSi_{1-x}O_{2-y}$ ($0.81 \leq x \leq 0.99$, $0.10 \leq y \leq 0.25$) in the measurement by XPS with an oxygen defect was formed. However, exactly the same tetragonal crystals as above can be obtained by using Hf, instead of Zr, and forming an amorphous insulating film that has a composition of $Hf_xSi_{1-x}O_{2-y}$ ($0.81 \leq x \leq 0.99$, $0.10 \leq y \leq 0.25$) in the measurement by XPS with an oxygen defect.

Figure 6:
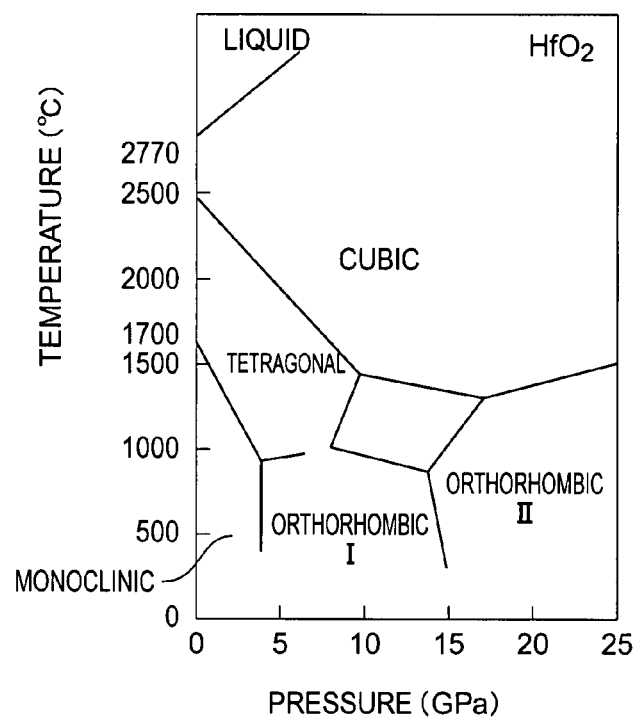
FIG. 6 is a temperature-pressure phase diagram about hafnia.

This is because Zr and Hf have chemical properties similar to each other. Even with the technology as of year 2006, there is 1% of Hf contained in generally available Zr. Although it is possible to separate the Hf from the Zr, doing so (to emphasize the small difference between the two materials) is very costly. Like in Zr, there is 1% of Zr contained in Hf. As is apparent from those facts, the two materials have almost no differences. In a case where a Zr oxide is compared with a Hf oxide, for example, a similar phase diagram can be formed for the Hf oxide, as shown in FIG. 6 (see O. Ohtaka, H. Fukui, T. Kunisada, T. Fujisawa, K. Funakoshi, W. Utsumi, T. Irifune, K. Kuroda, and T. Kikegawa, J. Am. Ceram. Soc., 84[6] 1369-73 (2001)). Accordingly, it can be easily assumed that the tetragonal crystals in a Hf oxide can be stabilized by exactly the same mechanism as the mechanism that can stabilize the tetragonal crystals in a Zr oxide.

The composition of this film after the heat treatment was determined by a direct measurement method in accordance with RBS, to obtain the composition values of $Zr_{0.985}Si_{0.02}O_2$. Accordingly, it is assumed that a composition of $Zr_{0.985}Si_{0.0224}O_{1.90}$ is obtained by determining the molar ratio of [Si]/([Zr]+[Si]) by RBS and determining the amount of oxygen loss by XPS in the sample in an as-depo state before the heat treatment. Also, it is assumed that a composition of $Hf_xSi_{1-x}O_{2-y}$ ($0.76 \leq x \leq 0.985$, $0.10 \leq y \leq 0.25$) is obtained by determining the molar ratio of [Si]/([Hf]+[Si]) by a direct measurement method in accordance with RBS and determining the amount of oxygen loss by XPS in the above HfSiO film.

Fourth Embodiment

Next, a method for manufacturing a semiconductor device in accordance with a fourth embodiment of the present invention is described.

First, as shown in step S1 of FIG. 1, a $Zr_xSi_{1-x}O_{2-y}$ was formed on a silicon substrate that had an interface oxide layer removed through diluted hydrofluoric acid treatment. In XPS measurement, the formed film is an insulating film having an oxygen defect, with (x, y) being (1.00, 0.046), (0.99, 0.056), (0.98, 0.053), (0.94, 0.053), (0.90, 0.043), (0.86, 0.047), (0.86, 0.049), (0.86, 0.057), (0.86, 0.059), (0.86, 0.061), (0.86, 0.062), (0.86, 0.116), or (0.81, 0.083), or an insulating film without an oxygen defect, with x being 1.00, 0.99, 0.98, 0.90, 0.87, or 0.70.

When the molar ratio of [Si]/([Zr]+[Si]) is measured by RBS while the oxygen defect is measured by XPS, the above film is an insulating film having an oxygen defect, with (x, y) being (1.00, 0.046), (0.985, 0.056), (0.97, 0.053), (0.92, 0.053), (0.86, 0.043), (0.81, 0.047), (0.81, 0.049), (0.81, 0.057), (0.81, 0.059), (0.81, 0.061), (0.81, 0.062), (0.81, 0.116), or (0.76, 0.083), or an insulating film without an oxygen defect, with x being 1.00, 0.985, 0.97, 0.86, 0.81, or 0.66.

Figure 7:
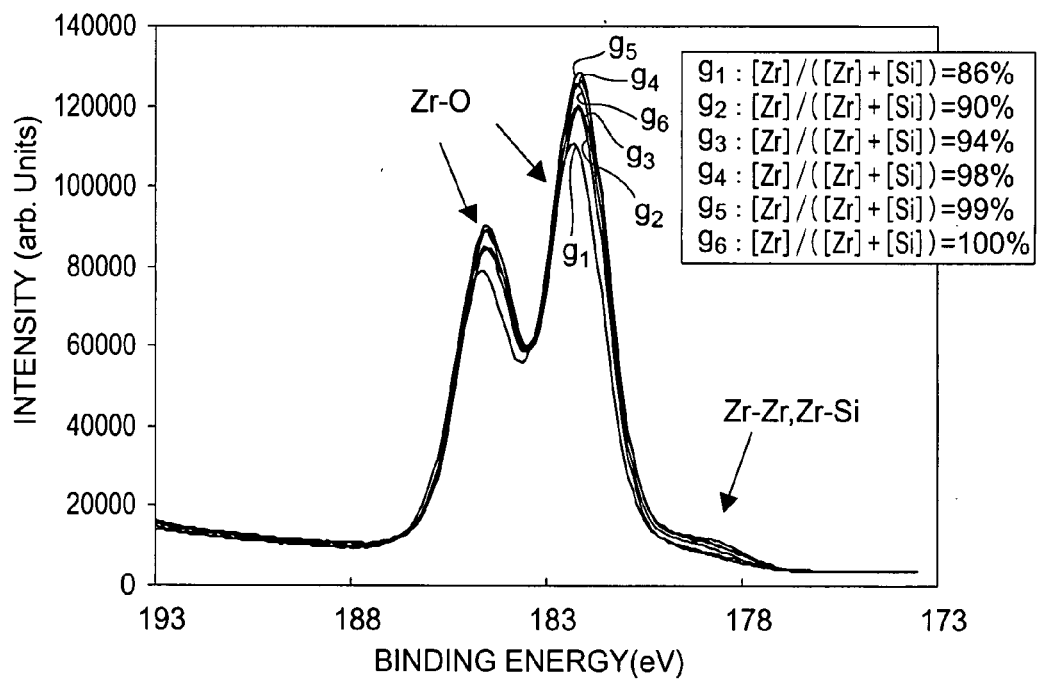
FIG. 7 shows the existence of a Zr—Si bond by XPS in an insulating film that has an oxygen defect and is produced by a manufacturing method in accordance with a fourth embodiment.

In the case of an insulating film having an oxygen defect, XPS measurement was carried out to confirm that a Zr—Si bond due to the oxygen defect was observed, as shown in FIG. 7.

In the case of an insulating film without an oxygen defect, only an amorphous film or monoclinic crystals or cubic crystals were formed even by a deposition method or through annealing.

Next, as shown in step S2 of FIG. 1, annealing was performed on an insulating film having an oxygen defect. In this case, substantially perfect tetragonal crystals were formed under any of the following annealing conditions: (750° C., in a nitrogen gas, 30 seconds), (750° C., in a nitrogen gas, 60 seconds), (750° C., in a nitrogen gas, 2 minutes), (750° C., in a nitrogen gas, 4 minutes), (750° C., in a nitrogen gas, 8 minutes), (750° C., 3% of oxygen and 97% of nitrogen, 30 seconds), (750° C., 3% of oxygen and 97% of nitrogen, 60 seconds), (750° C., 3% of oxygen and 97% of nitrogen, 2 minutes), (750° C., 3% of oxygen and 97% of nitrogen, 4 minutes), (750° C., 3% of oxygen and 97% of nitrogen, 8 minutes), (750° C., in an oxygen gas, 30 seconds), (750° C., in an oxygen gas, 1 minute), (750° C., in an oxygen gas, 2 minutes), (750° C., in an oxygen gas, 4 minutes), (750° C., in an oxygen gas, 8 minutes), (1000° C., in a nitrogen gas, 30 seconds), (1000° C., in a nitrogen gas, 60 seconds), (1000° C., in a nitrogen gas, 2 minutes), (1000° C., in a nitrogen gas, 4 minutes), (1000° C., in a nitrogen gas, 8 minutes), (1000° C., 3% of oxygen and 97% of nitrogen, 30 seconds), (1000° C., 3% of oxygen and 97% of nitrogen, 60 seconds), (1000° C., 3% of oxygen and 97% of nitrogen, 2 minutes), (1000° C., 3% of oxygen and 97% of nitrogen, 4 minutes), (1000° C., 3% of oxygen and 97% of nitrogen, 8 minutes), (1000° C., in an oxygen gas, 30 seconds), (1000° C., in an oxygen gas, 1 minute), (1000° C., in an oxygen gas, 2 minutes), (1000° C., in an oxygen gas, 4 minutes), and (1000° C., in an oxygen gas, 8 minutes).

There are two purposes of the annealing process in this case: the first one is to compensate for the oxygen defect; and the second one is to secure the stability of the structure against the heat treatment or to make sure that there is no relaxation or self-destruction in the structure. The results of this embodiment serve both purposes. Particularly, the second purpose is well served, as the tetragonal crystals can be maintained as they are even under the above various heat treatment conditions. Accordingly, this embodiment should be very useful when applied to an actual LSI process that involves various heat treatment procedures.

When the annealing conditions were more closely examined, it was confirmed that, with the oxygen concentration in the atmosphere being 1% or higher, minute silicide crystals unsuitable for a gate insulating film could be completely prevented from growing at the interface with the silicon substrate. Accordingly, an oxygen concentration of 1% or higher in the atmosphere is a more preferred annealing condition.

Figure 8:
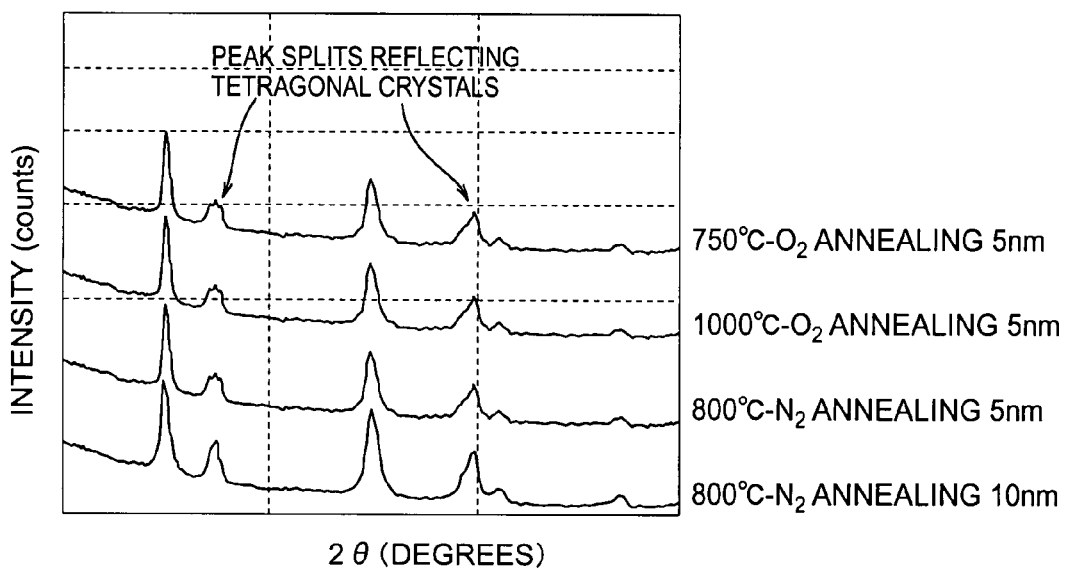
FIG. 8 shows X-ray diffraction profiles indicating that tetragonal crystals are obtained in thin insulating films of 10 nm or 5 nm in film thickness produced by a manufacturing method in accordance with the fourth embodiment.

As insulating films each having a composition of (0.86, 0.049) in the XPS measurement and a composition of (0.81, 0.049) in the RBS measurement, samples of 110 nm, 50 nm, 20 nm, 10 nm, and 5 nm in film thickness were prepared, and the oxygen defect was compensated for by performing annealing under the following conditions: (750° C., in an oxygen gas, 30 seconds), (800° C., in a nitrogen gas, 30 seconds), and (1000° C., in an oxygen gas, 30 seconds). An in-plane X-ray diffraction test was conducted for the insulating films of 10 nm and 5 nm in thickness, and the crystalline structures were examined to find perfectly tetragonal, fluorite-type crystalline structures, as shown in FIG. 8. We confirmed that every peak position coincided with tetragonal one. As for the insulating films of 10 nm in thickness, the in-plane X-ray diffraction test was conducted only for the samples annealed under the condition of (800° C., in a nitrogen gas, 30 seconds), and the result of this test is shown in FIG. 8.

There were conventional tetragonal zirconia films that had silicon added thereto. However, many of them are power samples or sintered samples, or are thick films of approximately 1 μm in thickness formed by the sol-gel method or the like.

Accordingly, thin films of 5 nm and 10 nm in thickness that can be used as gate insulating films, interpoly insulating films, or blocking insulating films as disclosed in this embodiment were unheard of. The molecular volume $V_m$ of those films calculated on the basis of X-ray diffraction data (lattice constants) was in the range of $0.03353$ nm$^3 \leq V_m \leq 0.03424$ nm$^3$ per $Zr_xSi_{1-x}O_2$. The molecular volume reduction rate was 3%. Accordingly, it is reaffirmed that those films of this embodiment have in-film stress that can endure a LSI process, unlike the insulating film disclosed in Reference 3, which has the molecular volume reduction rate of 9%.

The reason that the in-film stress by the manufacturing method of this embodiment can endure a LSI process is considered to be the difference in manufacturing method. By the manufacturing method of this embodiment, after an amorphous ZrSiO film is formed, tetragonal crystals are obtained through an annealing process that is a thermal quasi-equilibrium process. As a result of the semi thermal equilibrium process, the in-film stress is reduced.

By the method disclosed in Reference 3, on the other hand, a HfSiO film is formed by performing sputtering on a $HfO_2$ target and a $SiO_2$ target. It is a well-known fact that a sputtering process as a thermal nonequilibrium process generates a large in-film stress.

In this embodiment, the relative permittivity of each of the insulating films having the oxygen defect compensated for after the annealing was measured. The compositions in the XPS measurement before the annealing were (1.00, 0.046), (0.99, 0.056), (0.98, 0.053), (0.94, 0.053), (0.90, 0.043), and (0.86, 0.047). The compositions in the XPS measurement after the annealing were (1.00, 0.00), (0.99, 0.00), (0.98, 0.00), (0.94, 0.00), (0.90, 0.00), and (0.86, 0.00), with the oxygen defect having been compensated for.

With the molar ratio of [Si]/([Zr]+[Si]) being measured by RBS and the oxygen defect amount being measured by XPS, the composition of the samples before the annealing are considered to be (1.00, 0.046), (0.985, 0.056), (0.97, 0.053), (0.92, 0.053), (0.86, 0.043), and (0.81, 0.047). The compositions after the annealing were (1.00, 0.00), (0.985, 0.00), (0.97, 0.00), (0.92, 0.00), (0.86, 0.00), and (0.81, 0.00). In the estimates of the amounts of oxygen defect by XPS, the oxygen defect was compensated for.

For measurement of electric properties, a gold electrode was formed on each film after the annealing, so as to make sure that the electrode resistance was sufficiently low.

Figure 9:
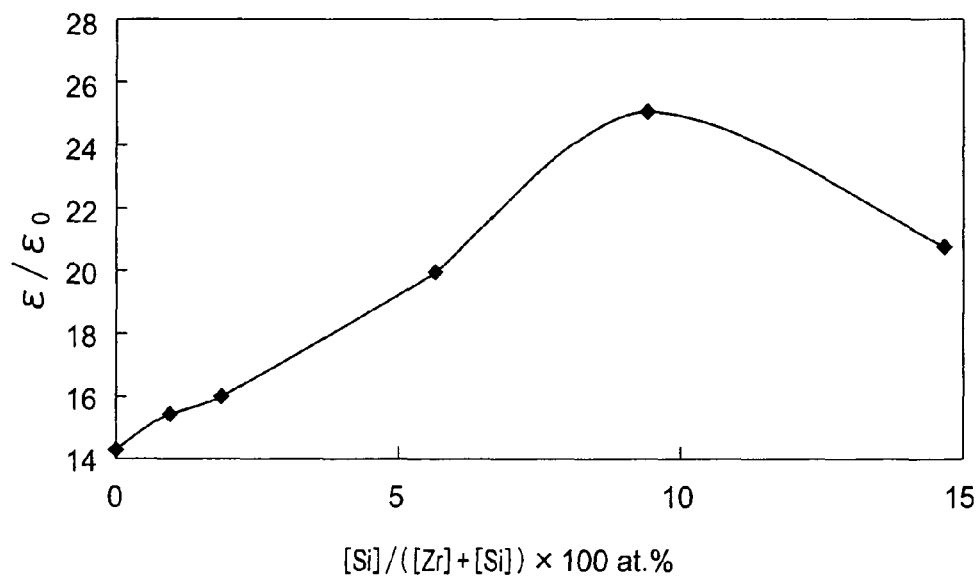
FIG. 9 shows the relative permittivity observed by examining the electric properties of insulating films produced by the manufacturing method in accordance with the fourth embodiment.

FIG. 9 shows the results of the relative permittivity measurement. In FIG. 9, the abscissa axis indicates the value of $([Si]/([Si]+[Zr]))\times 100$ (atomic %) measured by XPS, and the ordinate axis indicates the relative permittivity of each insulating film or the ratio of the permittivity $\epsilon$ of the insulating film to the permittivity $\epsilon_0$ of vacuum. As can be seen from FIG. 9, the relative permittivity was 20 to 26, with the value of x measured by XPS in a $Zr_xSi_{1-x}O_2$ film being in the range of 0.86 to 0.94 (with the value of z in a $Zr_{1-z}Si_zO_2$ film being in the range of 0.06 to 0.14). Since the relative permittivity of a conventional $ZrO_2$ film was approximately 17, increases in permittivity were confirmed.

In this embodiment, the molar polarizability $\alpha$ of the atoms in insulating films each having the oxygen defect compensated for after the annealing was calculated with the use of the above measured relative permittivity and lattice constant and the Clausius-Mosotti equation, to find increases to $0.00679$ $nm^3 < \alpha \leq 0.00735$ $nm^3$. This result is apparently different from the result disclosed in Reference 3, which is that the molar polarizability of atoms hardly varies even though the permittivity increases as the crystalline system is changed to a tetragonal crystalline system. Therefore, this embodiment should be considered to have successfully produced a different substance from the substance disclosed in Reference 3.

When the crystalline structure of each of the insulating films of $Zr_xSi_{1-x}O_2$ formed in this embodiment was more closely examined, it was found that not only tetragonal crystals but also an orientation that allows the effective use of the crystal axis with the higher permittivity was obtained. In a gate electrode of a transistor, an interelectrode insulating film of a flash memory, a blocking insulating film of a flash memory, or a capacitor insulating film, it is the permittivity in the film thickness direction that affects a real device. Therefore, where the crystal axis with the higher permittivity is oriented in the film thickness direction, higher permittivity can be achieved.

As an examination result, it was confirmed that, in the sample having a value of 0.90 as the composition ratio x of Zr measured by XPS, the [110] orientation as the crystal axis with the higher permittivity in the tetragonal crystals, which is the a' axis direction, was substantially in parallel with the film thickness direction, and the permittivity of the sample was actually the highest (see FIG. 9). Here, the composition ratio x of Zr as a value measured by RBS was 0.86. With cells twice as many as the unit cells being taken into account, the [110] orientation in the unit cells is set as the a' axis of the cells twice as many as the unit cells. It should be noted that the a' axis is referred to simply as the "a axis" in some documents.

Meanwhile, it was confirmed that, in the sample having a value of 0.94 as the composition ratio x of Zr measured by XPS, the c axis as the crystal axis with the lower permittivity in the tetragonal crystals was substantially in parallel with the film thickness direction, and the permittivity of the sample was actually the lowest in the tetragonal crystals. Here, the composition ratio x of Zr as a value measured by RBS was 0.92. In each of the insulating films of $Zr_xSi_{1-x}O_2$ formed in this embodiment, the c' axis of the cells twice as many as the unit cells is exactly the same as the c axis of the unit cells. Furthermore, the difference in length between the a' axis and the c' axis is approximately 3%, for example, and the length of the a' axis is always smaller than the length of the c' axis.

Further, the sample having a value of 0.86 as the composition ratio x of Zr measured by XPS had a value of 0.81 as the composition ratio x measured by RBS. However, it was confirmed that an orientation was not observed though tetragonal crystals were obtained. Actually, the permittivity of this sample was lower than the permittivity of the sample having a value of 0.90 as the composition ratio x of Zr measured by XPS or the sample having a value of 0.86 as the composition ratio x measured by RBS, but was higher than the permittivity of the sample having a value of 0.94 as the composition ratio x of Zr measured by XPS or the sample having a value of 0.92 as the composition ratio x measured by RBS (see FIG. 9). The estimates made through the first principle calculations were different from the experimental values quantitatively, but were proved to be qualitatively correct through experiments.

Figure 14:
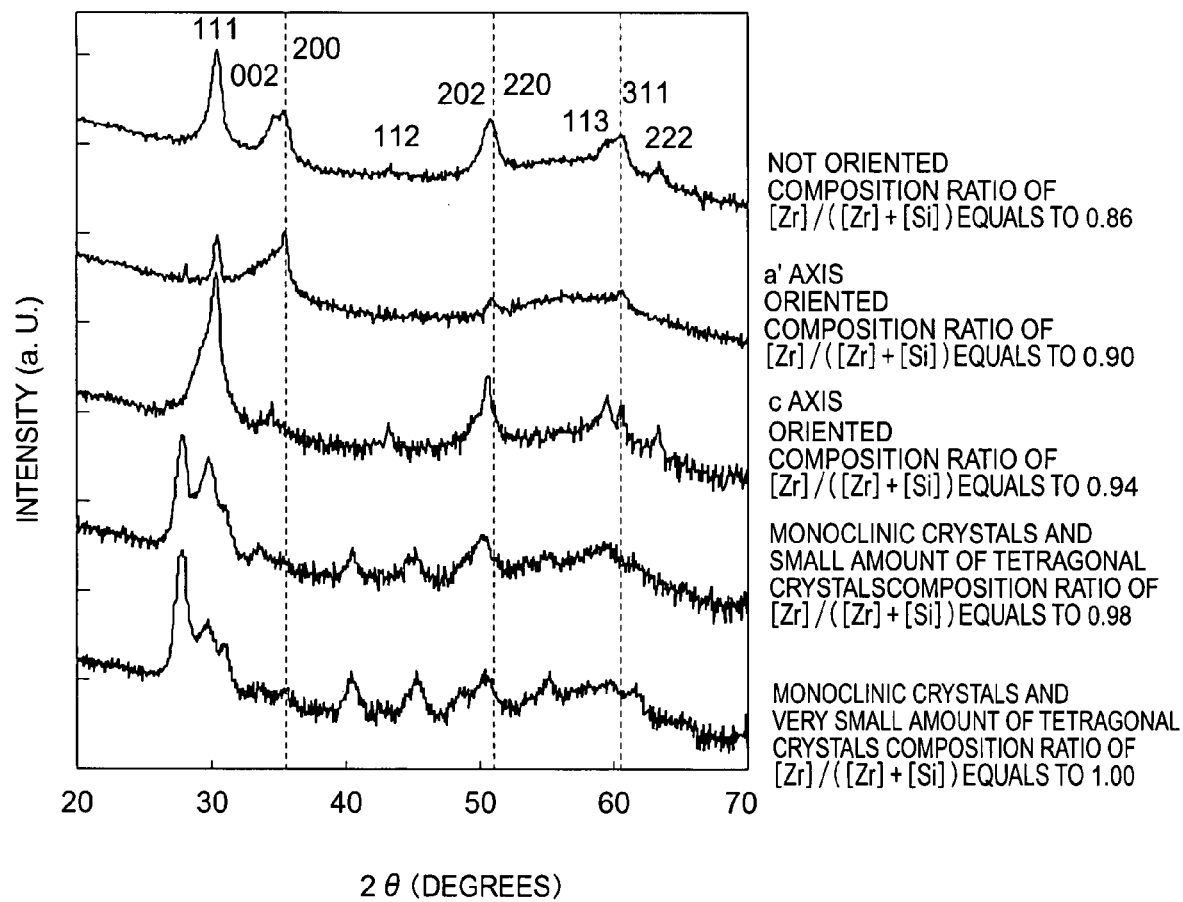
FIG. 14 shows the X-ray diffraction profiles of insulating films of Zr$_x$Si$_{1-x}$O$_2$ where the composition ratio x of Zr is 0.86, 0.90, 0.94, 0.98, and 1.00 in XPS measurement.

FIG. 14 shows the X-ray diffraction profiles of insulating films of $Zr_xSi_{1-x}O_2$, with the value x of Zr in the XPS measurement being 0.86, 0.90, 0.94, 0.98, and 1.00, or with the value of x of Zr in the RBS measurement being 0.81, 0.86, 0.92, 0.97, and 1.00. Since the peak intensities are logarithmically plotted in FIG. 14, attention is required when the peak intensities are compared with one another. In this specification, an index is put to the diffraction peaks in the X-ray diffraction profiles shown in FIG. 14, with the use of cells twice as many as the unit cells. The diffraction index used here is a', b', and c, instead of a, b, and c crystalline system. In FIG. 14, "111," "002", "200", "112", "202", "220", "113", "311", and "222" represent the diffraction index a', b', and c crystalline system.

In the sample having a value of 0.86 as the composition ratio x of Zr measured by XPS or the sample having a value of 0.81 as the composition ratio x measured by RBS, the diffraction peak of 200 in diffraction index that is the sum of the diffraction peak 200 in the a' axis and the diffraction peak 020 in the b' axis, which are equivalent to each other, is larger than the peak of 002 in diffraction index in the c-axis as a single peak. Likewise, the peak of 300 in diffraction index is the sum of the equivalent diffraction index 131 and the diffraction peak 300, but is larger than the peak of 113 in diffraction index as a single peak. Since those peak intensities are affected by minute atom displacements, the intensity ratio is not always 2:1. However, as long as the sample has no orientations, the intensity ratio does not change as much as to reverse the relationship in intensity. In practice, the intensity ratio is close to 2:1. Accordingly, the sample having a value of 0.86 as the composition ratio x of Zr measured by XPS or the sample having a value of 0.81 as the composition ratio x measured by RBS does not have an orientation. Also, in the sample having a value 0.90 as the composition ratio x of Zr, the diffraction peak in the a' axis direction, such as the diffraction index 200, is very intense, and the a' axis lies in the film thickness direction. In the sample having a value 0.94 as the composition ratios x of Zr measured by XPS or the sample having a value of 0.92 as the composition ratio x measured by RBS, the peaks having components of the c-axis direction, such as the diffraction indexes 200, 112, 202, and 113, are relatively intense, and there is an orientation in the c axis direction.

As in the above described case, it can be easily assumed that the tetragonal crystals in a Hf oxide can be stabilized by exactly the same mechanism as the mechanism that can stabilize the tetragonal crystals in a Zr oxide.

Although the heat treatment temperature is in the range of 750° to 1000° C. in this embodiment, it is also possible to carry out the heat treatment at temperatures in the range of 750° C. to 1100° C.

Fifth Embodiment

Next, a semiconductor device in accordance with a fifth embodiment of the present invention is described. The semiconductor device of this embodiment is the same as the semiconductor device produced by any of the manufacturing method of the first through fourth embodiments, except that the insulating film is replaced with an insulating film formed with $(Zr_{1-z}Hf_z)_xSi_{1-x}O_{2-y}$ (in the XPS measurement: $0 \leq z \leq 1$, $0.86 \leq x \leq 0.99$; in the RBS measurement: $0 \leq z \leq 1$, $0.81 \leq x \leq 0.985$, $0.04 \leq y \leq 0.25$).

Figure 10:
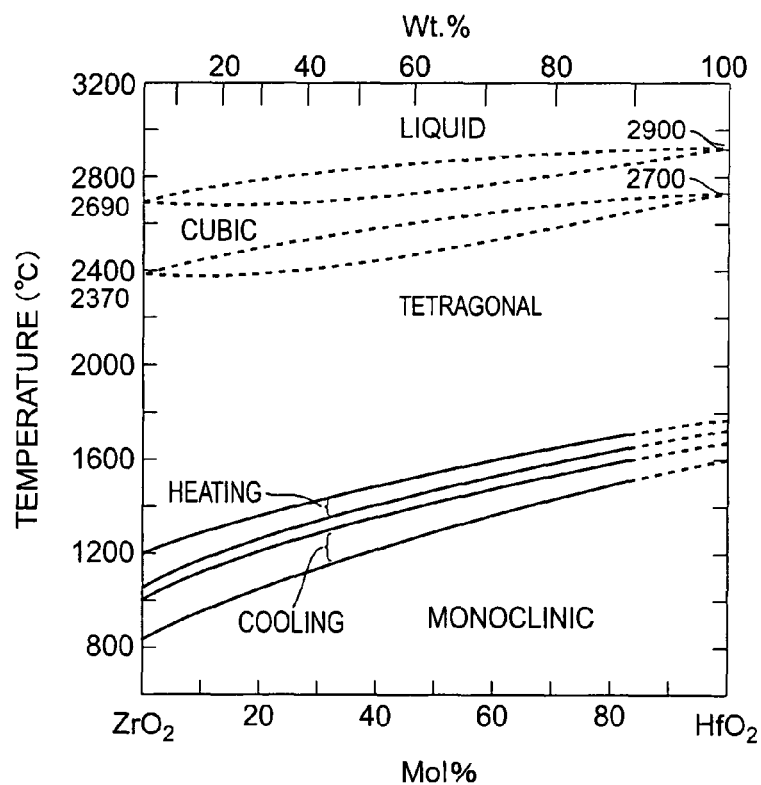
FIG. 10 is a phase diagram of HfO$_2$ and ZrO$_2$ at all ratios.

It is a known fact that $ZrO_2$ and $HfO_2$ can form mixed crystals at any ratio. FIG. 10 shows a phase diagram of $ZrO_2$ and $HfO_2$ at all the ratios (see Ruh, H. J. Garrett, R. F. Domagla, and N. M. Tallan, J. Amer. Ceram. Soc., 51, [1]27 (1968)). The phase diagram of FIG. 10 is a very simple diagram, and the regions of the respective phases of tetragonal crystals, cubic crystals, and monoclinic crystals exist for all the compositions ranging from $ZrO_2$ to $(Hf_zZr_{1-z})O_2$ to $HfO_2$. The boundaries of the respective phases do not cross one another. It can be considered that such a phase diagram is obtained, because Zr and Hf have chemical properties very similar to each other.

Accordingly, as in the first through fourth embodiments, an amorphous insulating film formed with $(Zr_{1-z}Hf_z)_xSi_{1-x}O_{2-y}$ (in the XPS measurement: $0 \leq z \leq 1$, $0.86 \leq x \leq 0.99$; with the molar ratio of $[Si]/([Zr]+[Hf]+[Si])$ and the molar ratio of $[Hf]/([Zr]+[Hf])$ being measured by RBS, with the amount of oxygen defect being measured by XPS, $0 \leq z \leq 1$, $0.81 \leq x \leq 0.985$, and $0 \leq z \leq 1$, $0.86 \leq x \leq 0.99$, $0.04 \leq y \leq 0.25$) can be transformed into $(Hf_zZr_{1-z})_xSi_{1-x}O_2$ ($0 \leq z \leq 1$, in the XPS measurement: $0.86 \leq x \leq 0.99$, in the RBS measurement: $0.81 \leq x \leq 0.985$) by annealing, so as to compensate for the oxygen defect and obtain tetragonal crystals. Since an increase in permittivity by virtue of the tetragonal crystals is achieved with $ZrO_2$ and $HfO_2$, it is also achieved with $(Zr_{1-z}Hf_z)O_2$, which is an intermediate state between the two oxides. The same applied to cases where tetragonal crystals are obtained by adding a very small amount (x in this case) of Si.

Thus, this embodiment can achieve the same effects as those of the first through fourth embodiments, with $(Zr_{1-z}Hf_z)_xSi_{1-x}O_2$ being used as an insulating film.

As described so far, in the first through fifth embodiments of the present invention, insulating films with such high permittivity that cannot be formed with conventional high-k insulating films of zirconia or hafnia can be produced by adding Si, which is highly compatible with conventional semiconductor processes. The high-k insulating films of the above described embodiments are zirconia-based films, hafnia-based films, or films formed with a mixed material of zirconia and hafnia.

In each of the first through fifth embodiments of the present invention, the in-film stress is restricted to 1 GPa or less, and the molecular volume hardly affects the mechanism of increasing the permittivity. Accordingly, there are fewer distortions in the films, and the problem of relaxation and the problem of self-destruction due to stress can be solved.

Sixth Embodiment

Next, a semiconductor device in accordance with a sixth embodiment of the present invention is described.

The semiconductor device of this embodiment has an insulating film with compensated oxygen that is disclosed in any one of the first through fifth embodiments. In this embodiment, the insulating film is used as a gate insulating film of a MOS, particularly, as a gate insulating of a CMOS, an interelectrode insulating film of a flash memory, or a blocking insulating film of a flash memory.

Figure 11:
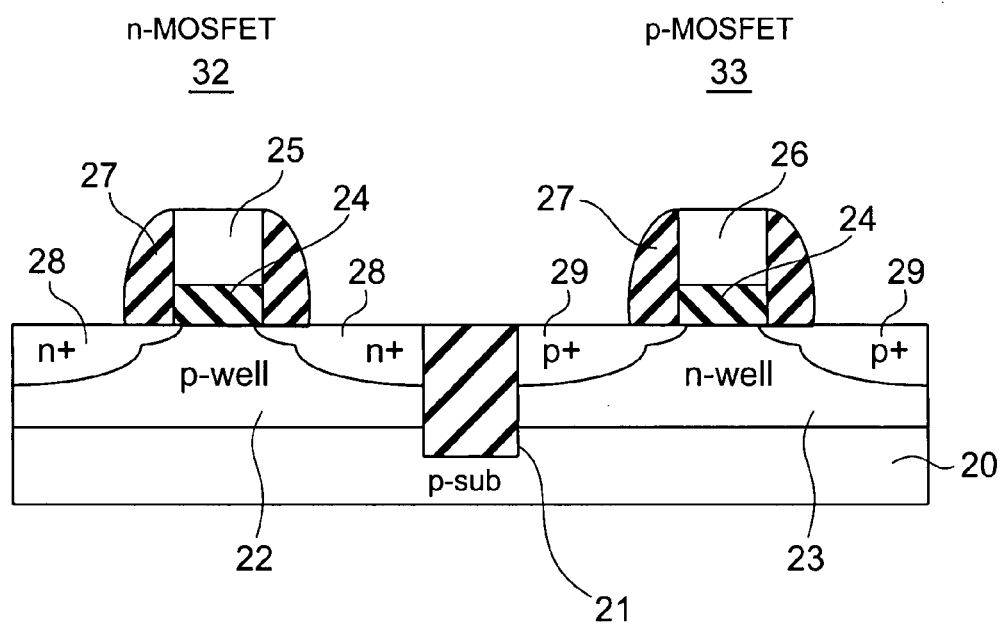
FIG. 11 is a cross-sectional view of a CMOS device as a specific example of a sixth embodiment.

FIG. 11 is a cross-sectional view of a semiconductor device having a CMOSFET as a first specific example of this embodiment. This semiconductor device as the first specific example includes an n-channel MOSFET 32 and a p-channel MOSFET 33 that are formed on a semiconductor substrate 20. The n-channel MOSFET 32 is provided in a p-well region 22 formed in the semiconductor substrate 20. The n-channel MOSFET 32 includes a gate insulating film 24 formed on the p-well region 22, a gate electrode 25 formed on the gate insulating film 24, source and drain regions 28 formed with $n^+$-impurity regions located at portions of the p-well region 22 on either side of the gate electrode 25, and gate sidewalls 27 formed with an insulating material provided on the side faces of the gate electrode 25.

The p-channel MOSFET 33 is provided in an n-well region 23 formed in the semiconductor substrate 20. The p-channel MOSFET 33 includes a gate insulating film 24 formed on the n-well region 23, a gate electrode 26 formed on the gate insulating film 24, source and drain regions 29 formed with $p^+$-impurity regions located at the portions of the n-well region 23 on either side of the gate electrode 26, and gate sidewalls 27 formed with an insulating material provided on the side faces of the gate electrode 26. The p-well region 22 and the n-well region 23 are isolated from each other by a device isolating region 21. The source and drain regions 28 and 29 have extension regions that extend below the gate insulating films 24.

In the semiconductor device as the first specific example, the gate insulating film 24 of each of the n-channel MOSFET 22 and the p-channel MOSFET 23 is an insulating film with compensated oxygen that is disclosed in any one of the first through fifth embodiments.

Figure 12:
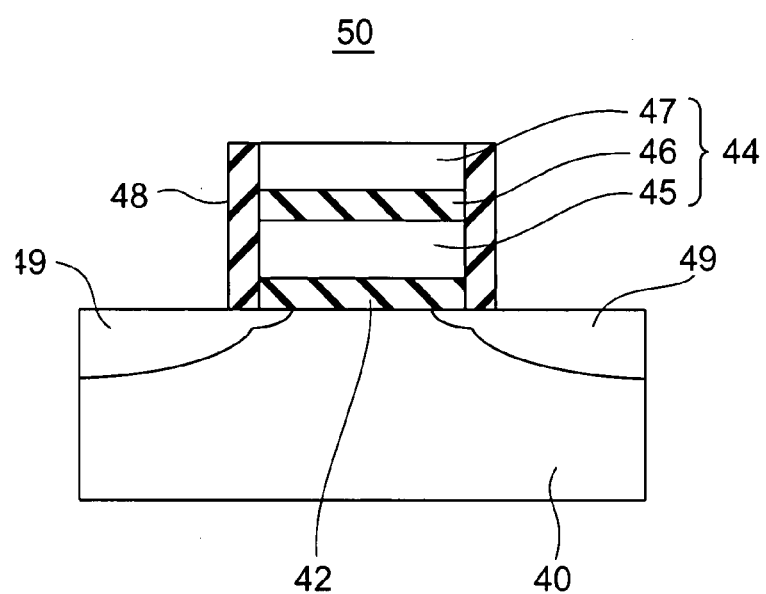
FIG. 12 is a cross-sectional view of a memory cell of a floating gate type flash memory as a second specific example of the sixth embodiment.

Referring now to FIG. 12, a semiconductor device as a second specific example of this embodiment is described. This semiconductor device as the second specific example is a flash memory, and a cross-sectional view of a memory cell 50 is shown in FIG. 12. This memory cell 50 includes a tunnel insulating film 42 formed on a semiconductor substrate 40, a gate electrode 44 formed on the tunnel insulating film 42, source and drain regions 49 formed at the portions of the semiconductor substrate 40 on either side of the gate electrode 44, and gate sidewalls 48 formed with an insulating material provided on the side faces of the gate electrode 44. The gate electrode 44 includes a floating gate 45 formed on the tunnel insulating film 42, an interelectrode insulating film 46 formed on the floating gate 45, and a control gate 47 formed on the interelectrode insulating film 46. In this specific example, the interelectrode insulating film 46 is an insulating film with compensated oxygen that is disclosed in any one of the first through fifth embodiments.

Figure 15:
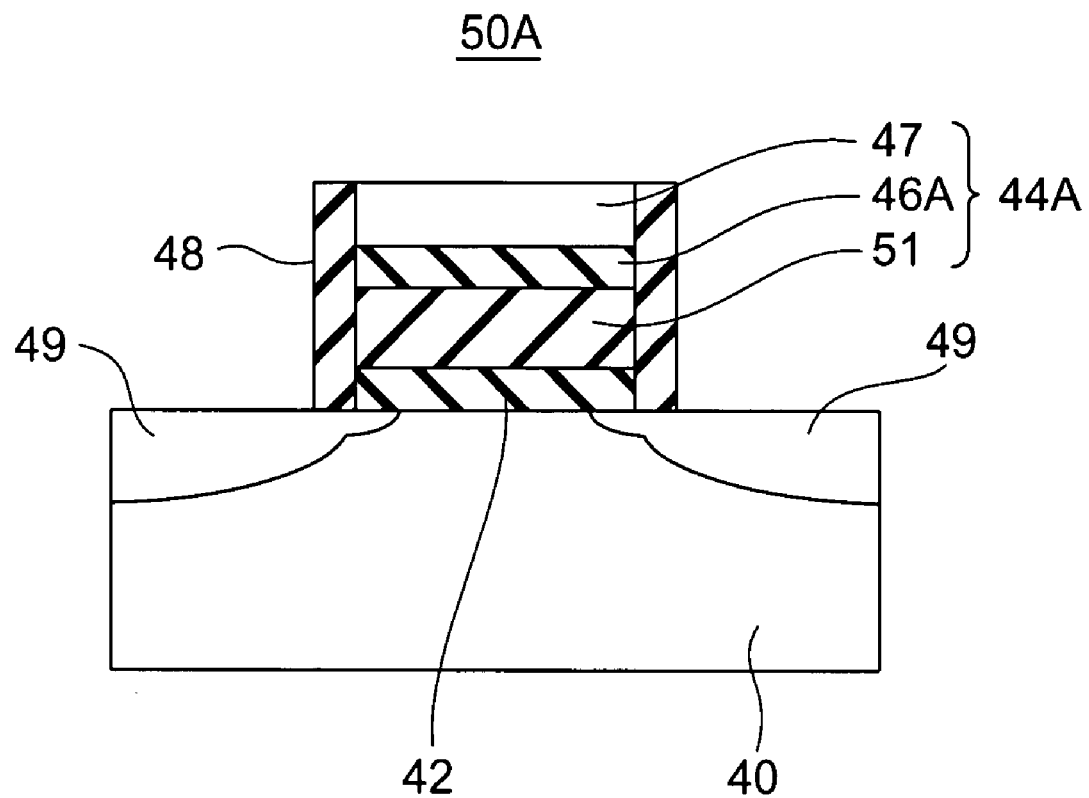
FIG. 15 is a cross-sectional view of a memory cell of a MONOS type flash memory.

In the second specific example, a floating gate type flash memory has been described. The insulating film with compensated oxygen that is disclosed in any one of the first through fifth embodiments is applicable to a MONOS (Metal-Oxide-Nitride-Oxide-Silicon) type flash memory. As shown in FIG. 15, the MONOS type flash memory 50A includes a memory cell that contains a tunnel insulating film 42 formed on a semiconductor substrate 40, a gate electrode 44A formed on the tunnel insulating film 42, source and drain regions 49 formed at the portions of the semiconductor substrate 40 on either side of the gate electrode 44A, and gate sidewalls 48 formed with an insulating material provided on the side faces of the gate electrode 44A. The gate electrode 44A includes a charge storing layer 51 formed on the tunnel insulating film 42, a blocking insulating film 46A formed on the charge storing layer 51, and a control gate 47 formed on the blocking insulating film 46A. The blocking insulating film 46A is an insulating film with compensated oxygen that is disclosed in any one of the first through fifth embodiments.

When the insulating film with compensated oxygen that is disclosed in any one of the first through fifth embodiments is used as the interelectrode insulating film or the blocking insulating film, the insulating film can be a single layer or a stacked layer.

Since the gate insulating films 24 of the first specific example, the interelectrode insulating film 46 of the second specific example and the blocking insulating film 46A of MONOS type flash memory of this embodiment are insulating films with compensated oxygen that are disclosed in any of the first through fifth embodiments, the in-film stress is restricted to 1 GPa or less, and the molecular volume hardly affects the mechanism of increasing the permittivity. Accordingly, there are fewer distortions in the films, and the problem of relaxation and the problem of self-destruction due to stress can be solved. Thus, device characteristics degradation can be prevented.

For reference, the results of XPS measurement and RBS measurement of Si compositions in the respective insulating films of the first through sixth embodiments of the present invention are shown in the table below.

TABLE

| Si Amount | |
|---|---|
| XPS composition | RBS composition |
| 0% | 0% |
| 1% | 1.5% |
| 2% | 3% |
| 6% | 8% |
| 10% | 14% |
| 14% | 19% |
| 19% | 24% |

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor device comprising:
    an insulating film containing $(Hf_zZr_{1-z})_xSi_{1-x}O_2$ ($0.81 \leq x \leq 0.99$, $0 \leq z \leq 1$) formed on a semiconductor substrate, the ranges of composition ratios x and z being values measured by XPS,
    the insulating film having a main phase that is a tetragonal fluorite-type crystalline structure,
    molecular volume $V_m$ of tetragonal crystals in the insulating film being in the range of $0.03353$ $nm^3 \leq V_m \leq 0.03424$ $nm^3$,
    the insulating film having a physical film thickness of 110 nm or smaller.

2. The semiconductor device according to claim 1, wherein lattice constants a, b, and c of tetragonal unit cells in the insulating film are in the ranges of $0.3590$ nm $\leq a \leq 0.3608$ nm, $0.3590$ nm $\leq b \leq 0.3608$ nm, and $0.5183$ nm $\leq c \leq 0.5212$ nm, respectively.

3. The semiconductor device according to claim 1, wherein:
    the insulating film has relative permittivity ranging from 20 to 26; and
    molar polarizability $\alpha$ of atoms constituting the insulating film is in the range of $0.00679$ nm$^3 < \alpha \leq 0.00735$ nm$^3$.

4. The semiconductor device according to claim 1, wherein a' axis of the tetragonal crystals in the semiconductor film extends substantially parallel to a film thickness direction of the insulating film.

5. The semiconductor device according to claim 1, wherein the insulating film is a gate insulating film of a CMOSFET.

6. The semiconductor device according to claim 1, wherein the insulating film is an interelectrode insulating film of a floating gate type flash memory.

7. The semiconductor device according to claim 1, wherein the insulating film is a blocking insulating film of a MONOS type flash memory.

8. The semiconductor device according to claim 1, wherein stress applied onto the insulating film is 1 GPa or smaller.

* * * * *